United States Patent
Ishii et al.

(10) Patent No.: US 11,011,996 B2
(45) Date of Patent: May 18, 2021

(54) POWER CONVERTER

(71) Applicant: HITACHI AUTOMOTIVE SYSTEMS, LTD., Hitachinaka (JP)

(72) Inventors: Akira Ishii, Hitachinaka (JP); Hiroyuki Saito, Hitachinaka (JP); Yutaka Okubo, Hitachinaka (JP); Ryuji Kurihara, Hitachinaka (JP); Yuji Sobu, Hitachinaka (JP)

(73) Assignee: HITACHI AUTOMOTIVE SYSTEMS, LTD., Hitachinaka (JP)

( * ) Notice: Subject to any disclaimer, the term of this patent is extended or adjusted under 35 U.S.C. 154(b) by 112 days.

(21) Appl. No.: 16/489,925

(22) PCT Filed: Jan. 29, 2018

(86) PCT No.: PCT/JP2018/002635
§ 371 (c)(1),
(2) Date: Aug. 29, 2019

(87) PCT Pub. No.: WO2018/179773
PCT Pub. Date: Oct. 4, 2018

(65) Prior Publication Data
US 2019/0386577 A1    Dec. 19, 2019

(30) Foreign Application Priority Data
Mar. 30, 2017    (JP)   .............................. JP2017-066637

(51) Int. Cl.
*H02M 7/44*     (2006.01)
*H05K 1/18*     (2006.01)
(Continued)

(52) U.S. Cl.
CPC .............. *H02M 7/003* (2013.01); *H02M 7/00* (2013.01); *H05K 1/0218* (2013.01); *H05K 5/006* (2013.01);
(Continued)

(58) Field of Classification Search
CPC .......... H02M 7/00; H02M 7/003; H02M 7/42; H02M 7/44; H05K 1/0218; H05K 1/18;
(Continued)

(56) References Cited

U.S. PATENT DOCUMENTS

2006/0086981 A1    4/2006   Yamaguchi
2015/0163961 A1    6/2015   Hara
(Continued)

FOREIGN PATENT DOCUMENTS

JP     2006-121834 A    5/2006
JP     2014-72938 A     4/2014
(Continued)

OTHER PUBLICATIONS

International Search Report with English translation and Written Opinion issued in corresponding application No. PCT/JP2018/002635 dated Mar. 27, 2018.

*Primary Examiner* — Gary L Laxton
(74) *Attorney, Agent, or Firm* — Foley & Lardner LLP

(57) ABSTRACT

An object of the present invention is to improve the reliability of a power converter against electromagnetic noise. A power converter according to the present invention includes: a power semiconductor circuit unit; a DCDC converter circuit unit; a first drive circuit board that outputs a drive signal to the power semiconductor circuit unit; a second drive circuit board that outputs a drive signal to the DCDC converter circuit unit; and a control circuit board that outputs a first control signal for controlling the first drive circuit board and a second control signal for controlling the second drive circuit board, in which the control circuit board is arranged at a position facing the second drive circuit board with the power semiconductor circuit unit and the DCDC converter circuit unit interposed therebetween, the first drive circuit board is arranged to be substantially parallel to an array direction of the control circuit board and the second
(Continued)

drive circuit board, and the first drive circuit board has a relay wiring that relays the second control signal output from the control circuit board to the second drive circuit board.

10 Claims, 10 Drawing Sheets

(51) Int. Cl.
    *H02M 7/00*     (2006.01)
    *H05K 1/02*     (2006.01)
    *H05K 5/00*     (2006.01)
    *H05K 9/00*     (2006.01)
    *H01R 12/71*     (2011.01)

(52) U.S. Cl.
    CPC ......... *H05K 5/0065* (2013.01); *H05K 5/0069* (2013.01); *H05K 9/002* (2013.01); *H01R 12/716* (2013.01); *H05K 5/0047* (2013.01)

(58) Field of Classification Search
    CPC .... H05K 5/006; H05K 5/0065; H05K 5/0069; H05K 9/002; H05K 5/0047; H01R 12/716
    See application file for complete search history.

(56) References Cited

U.S. PATENT DOCUMENTS

| | | | |
|---|---|---|---|
| 2015/0246619 A1 | 9/2015 | Nagao | |
| 2017/0040907 A1* | 2/2017 | Goto | ........................ H02M 7/44 |
| 2018/0048255 A1* | 2/2018 | Marvin | ................... H02P 27/06 |
| 2018/0287466 A1* | 10/2018 | Kim | ........................ H02P 27/06 |

FOREIGN PATENT DOCUMENTS

| | | |
|---|---|---|
| JP | 2015-53776 A | 3/2015 |
| JP | 2015-164367 A | 9/2015 |

\* cited by examiner

POWER CONVERTER

TECHNICAL FIELD

The present invention relates to a power converter, and more particularly to an integrated power converter in which a power semiconductor circuit unit and a DCDC converter circuit unit are integrally formed.

BACKGROUND ART

A vehicle such as a hybrid vehicle or an electric vehicle includes a DCDC converter circuit unit that converts high voltage and low voltage, and an inverter circuit unit that includes a power semiconductor circuit unit that converts DC power to AC power. With the miniaturization of vehicles, miniaturization of the DCDC converter circuit unit and the inverter circuit unit is also required.

Therefore, PTL 1 discloses a technology in which the DCDC converter circuit unit and the inverter circuit unit are accommodated in the same casing.

However, as electric products used in vehicles become high in voltage, further measures for parts constituting the DCDC converter circuit unit and the inverter circuit unit against electromagnetic noise need to be taken.

CITATION LIST

Patent Literature

PTL 1: JP 2014-72938 A

SUMMARY OF INVENTION

Technical Problem

Then, the technical problem to be solved by the present invention is to improve the reliability with respect to the electromagnetic noise of a power converter.

Solution to Problem

A power converter according to the present invention includes: a power semiconductor circuit unit that converts DC power into AC power to be supplied to a drive motor; a DCDC converter circuit unit that converts a voltage of DC power; a first drive circuit board that outputs a drive signal to the power semiconductor circuit unit; a second drive circuit board that outputs a drive signal to the DCDC converter circuit unit; and a control circuit board that outputs a first control signal for controlling the first drive circuit board and a second control signal for controlling the second drive circuit board, in which the control circuit board is arranged at a position facing the second drive circuit board with the power semiconductor circuit unit and the DCDC converter circuit unit interposed therebetween, the first drive circuit board is arranged such that a main surface of the first drive circuit board is substantially parallel to an array direction of the control circuit board and the second drive circuit board, and is arranged at a position facing the power semiconductor circuit unit, and the first drive circuit board has a relay wiring that relays the second control signal output from the control circuit board to the second drive circuit board.

Advantageous Effects of Invention

According to the present invention, the reliability of the power converter against the electromagnetic noise can be improved.

DESCRIPTION OF EMBODIMENTS

An embodiment according to the present invention will be described with reference to FIGS. 1 to 10.

Figure 1:
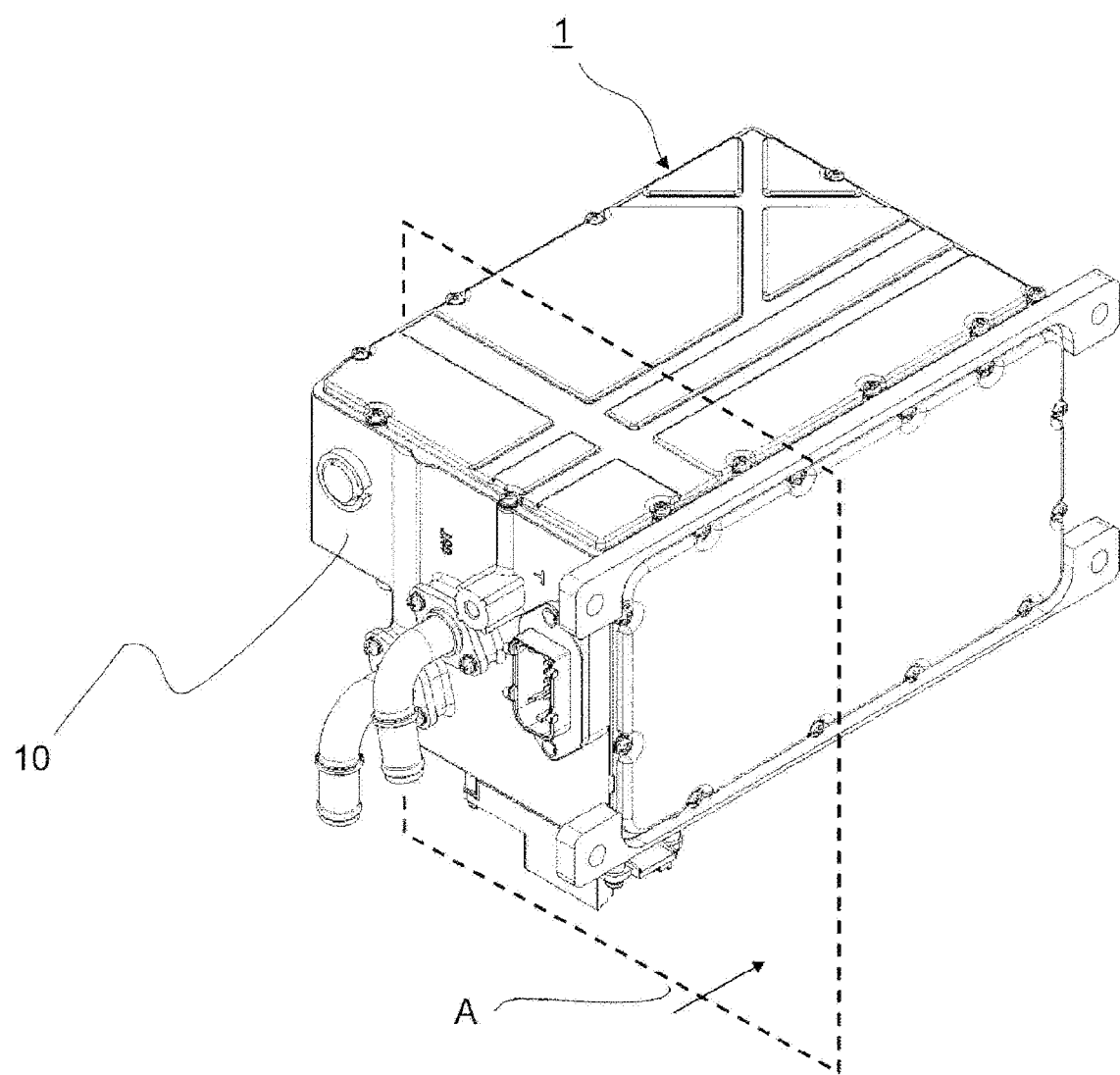
FIG. 1 is an overall perspective view of an integrated power converter 1 in which a power semiconductor circuit unit 20 and a DCDC converter circuit unit are integrally configured.
Figure 2:
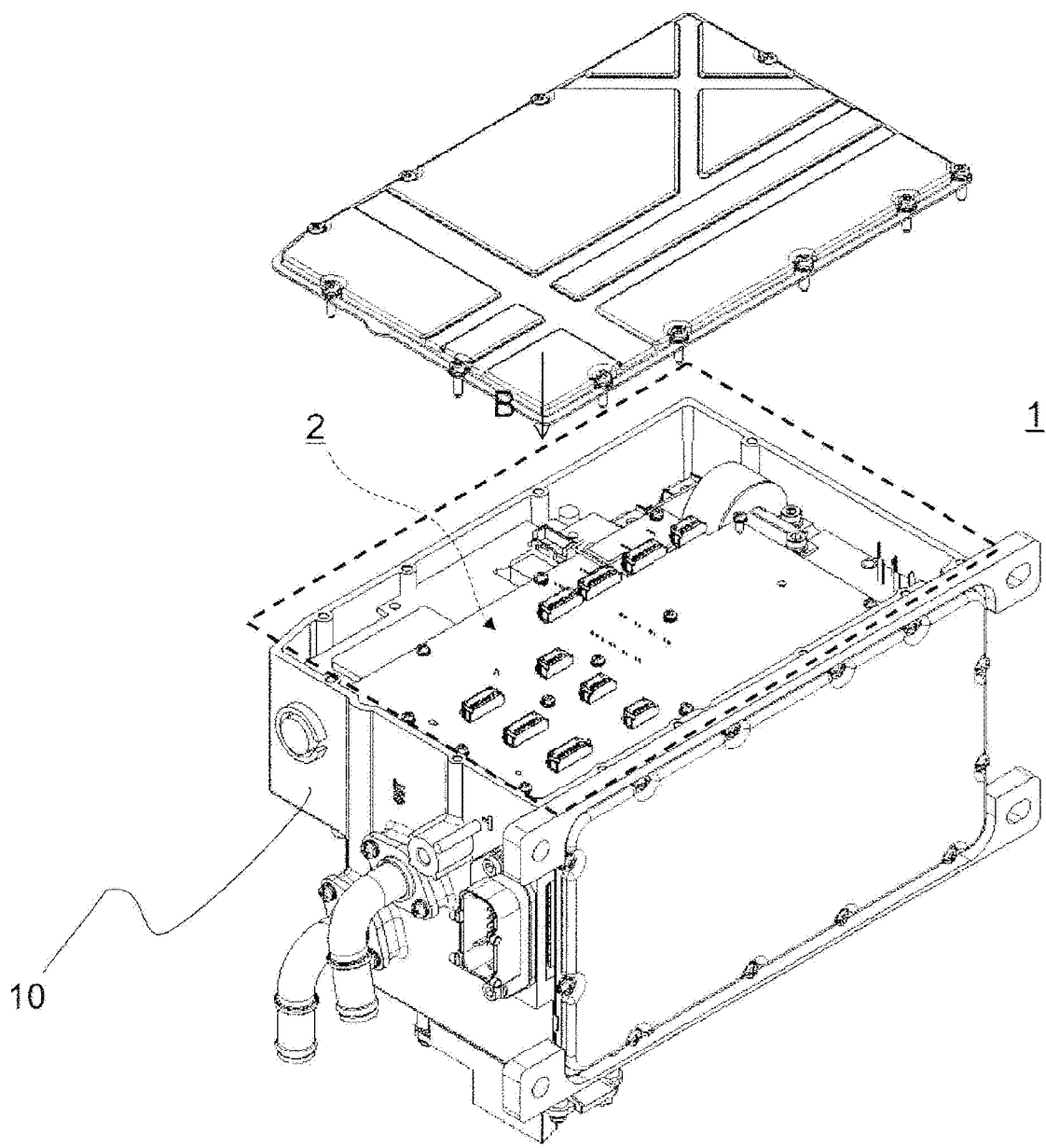
FIG. 2 is an overall perspective view of the integrated power converter 1 of FIG. 1 from which an upper side cover is removed.
Figure 3:
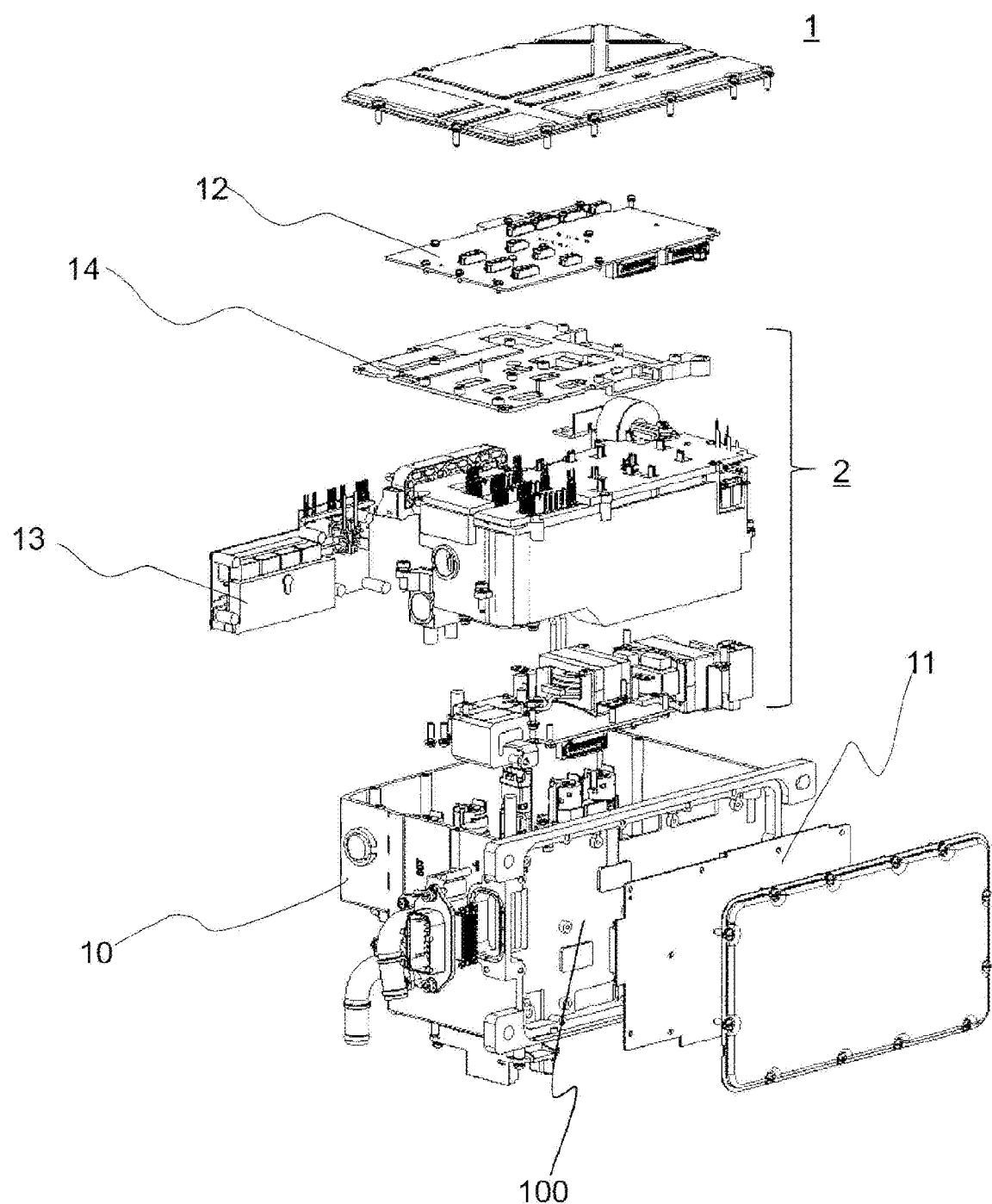
FIG. 3 is an exploded perspective view of the integrated power converter 1 of FIG. 1.
Figure 4:
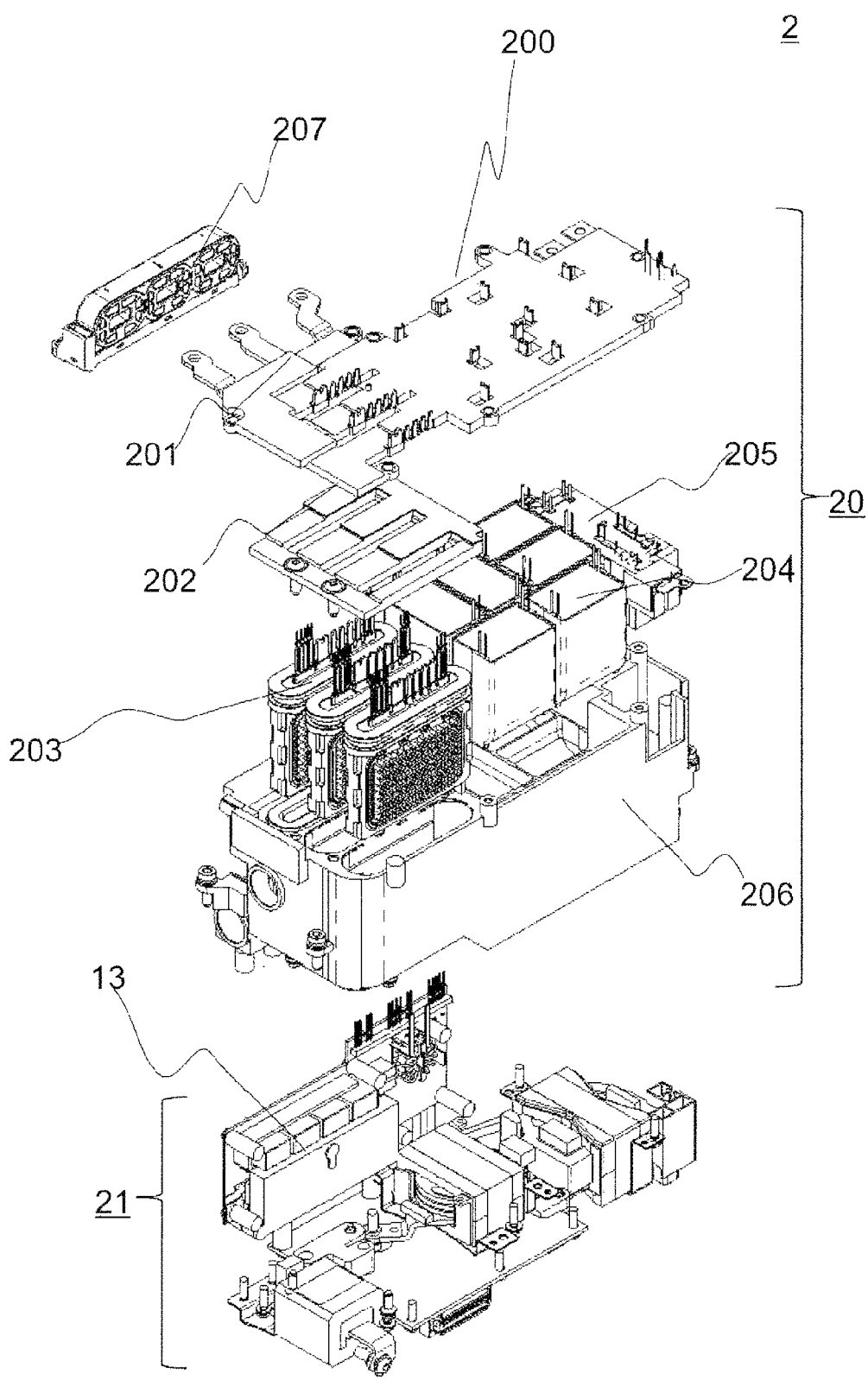
FIG. 4 is an exploded perspective view of a main circuit unit 2 of the integrated power converter 1.
Figure 5:
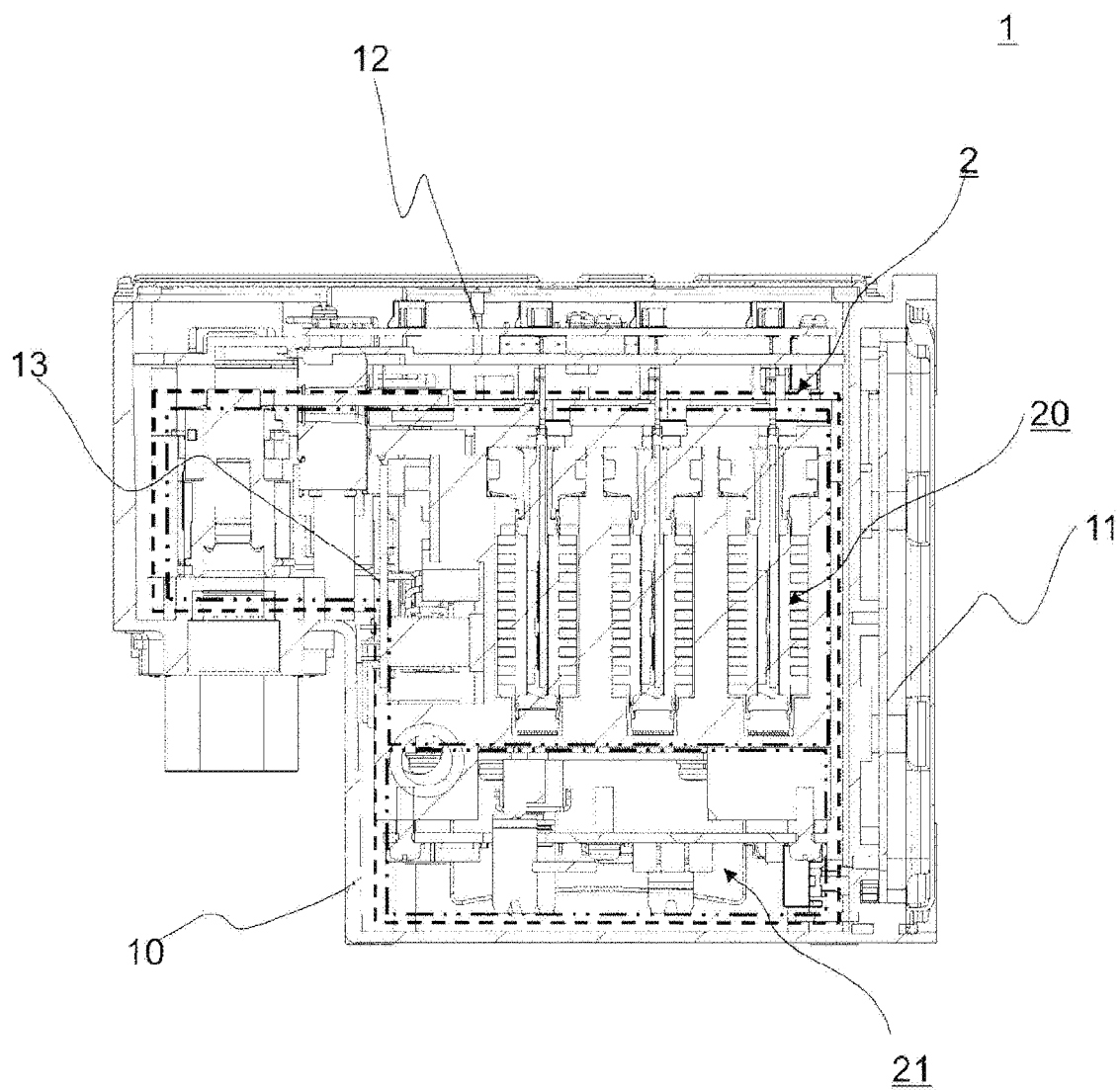
FIG. 5 is a cross-sectional view of the integrated power converter 1 of FIG. 1 viewed from an arrow direction of a surface A.
Figure 9:
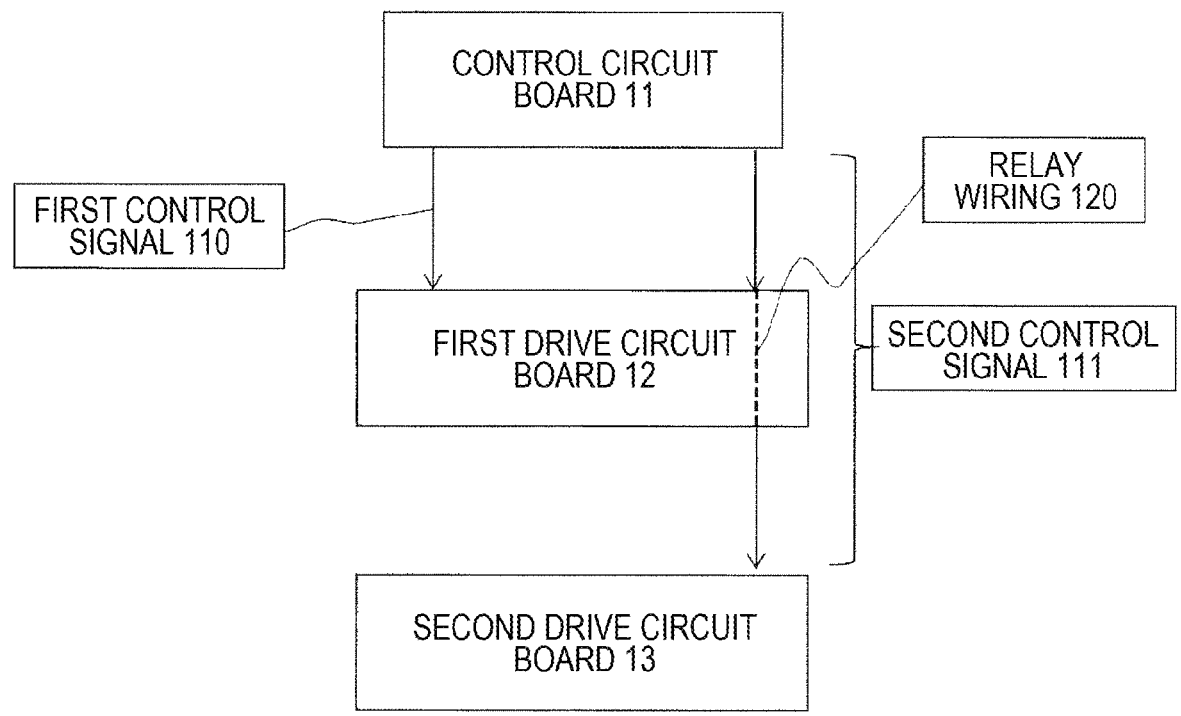
FIG. 9 is a block configuration diagram showing a flow of a control signal.

FIG. 1 is an overall perspective view of an integrated power converter 1 in which a power semiconductor circuit unit 20 and a DCDC converter circuit unit are integrally configured. FIG. 2 is an overall perspective view of the integrated power converter 1 of FIG. 1 from which an upper side cover is removed. FIG. 3 is an exploded perspective view of the integrated power converter 1 of FIG. 1. FIG. 4 is an exploded perspective view of a main circuit unit 2 of the integrated power converter 1. FIG. 5 is a cross-sectional view of the integrated power converter 1 of FIG. 1 viewed from an arrow direction of a surface A. FIG. 9 is a block configuration diagram showing a flow of a control signal.

As shown in FIG. 3, the integrated power converter 1 includes a main circuit 2, a control circuit board 11, a first drive circuit board 12, a second drive circuit board 13, a support member 14 that holds the first drive circuit board 12, and a casing 10 for accommodating these components.

The main circuit 2 includes a power semiconductor circuit unit 20 that converts DC power into AC power supplied to a drive motor, and a DCDC converter circuit unit 21 that converts a voltage of the DC power.

As shown in FIG. 4, a DC current is input to an input terminal 250, and is input to the power semiconductor module 203 via a DC bus bar 200. The DC current is also supplied to an X capacitor module 204 and an EMC filter module 205 for smoothing and noise removal.

The power semiconductor module 203 has an inverter circuit that converts DC power into AC power. The X capacitor module 204 smooths the DC power supplied to the inverter circuit. The DC bus bar 200 electrically connects the power semiconductor module 203 and the X capacitor module 204. An AC bus bar 201 penetrates a current sensor 207 that detects a current.

A flow path forming body 206 forms a flow path for cooling around the power semiconductor module 203, and is formed of aluminum die-cast. The flow path of the flow path forming body 206 may be formed to flow to a lower part or a side part of the X capacitor module 204 or the DCDC converter circuit unit 21, and cool the X capacitor module 204 or the DCDC converter circuit unit 21.

A base plate 202 is fixed to the flow path forming body 206 so as to cover the power semiconductor module 203. This suppresses the movement of the power semiconductor module 203 in a direction away from the flow path forming body 206.

The first drive circuit board 12 shown in FIGS. 3 and 5 outputs a drive signal to the power semiconductor module 203. The second drive circuit board 13 shown in FIGS. 4 and 5 outputs a drive signal to the DCDC converter circuit unit 21.

As shown in FIG. 9, the control circuit board 11 outputs a first control signal 110 for controlling the first drive circuit board 12 and a second control signal 111 for controlling the second drive circuit board 13.

The required size of the integrated power converter 1 as in the present embodiment is very small, and integration and same casing packaging, such as incorporation in the same casing, of the power semiconductor circuit unit 20 and the DCDC converter circuit unit 21 are required. However, the integration and same casing packaging of the power semiconductor circuit unit 20 and the DCDC converter circuit unit 21 tend to deteriorate the EMC performance due to noise interference between both circuit units.

The first drive circuit board 12 outputs a drive signal to the power semiconductor module 203. In the power semiconductor module 203, switching noise is generated when DC current is converted to AC current.

The second drive circuit board 13 outputs a drive signal to the DCDC converter circuit unit 21. Switching noise occurs when high voltage (several hundreds of volts) is converted to low voltage (12 V).

The control circuit board 11 outputs a first control signal 110 for controlling the first drive circuit board 12 and a second control signal 111 for controlling the second drive circuit board. The control circuit board 11 controls other substrates and connects with an external interface for signal transmission.

As shown in FIG. 5, the control circuit board 11 is arranged at a facing position apart from the second drive circuit board 13 with the power semiconductor circuit unit and the DCDC converter circuit unit 21 interposed therebetween, so that it is possible to reduce the influence of interference due to noise emitted from the second drive circuit board 13.

The first drive circuit board 12 is arranged so that a main surface is substantially parallel to an array direction of the control circuit board 11 and the second drive circuit board 13, and is arranged at a position facing the power semiconductor circuit unit 20.

The first drive circuit board 12 includes a relay wiring that forms a wiring for transmitting the second control signal 111 output from the control circuit board 11 on a pattern, and relays the signal to the second drive circuit board 13. As a result, assemblability can be improved and downsizing can be achieved as compared with the case where a harness relaying the second control signal 111 output from the control circuit board 11 is used.

Figure 10:
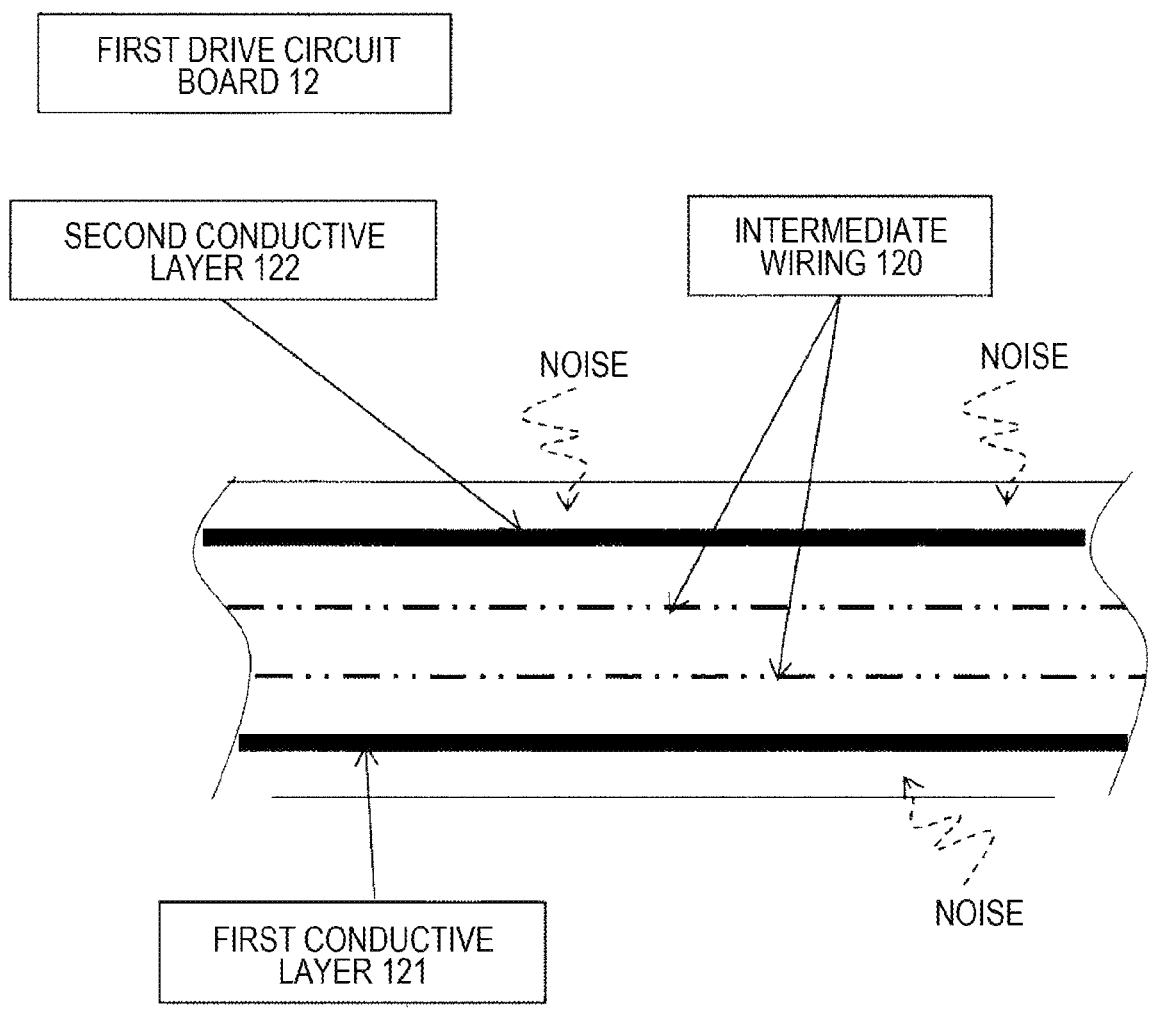
FIG. 10 is a cross-sectional view of a first drive circuit board 12 according to the present embodiment.

FIG. 10 is a cross-sectional view of a first drive circuit board 12 according to the present embodiment.

The first drive circuit board 12 has a relay wiring 120 relaying the second control signal 111 output from the control circuit board 11 to control the second drive circuit board 13.

The first drive circuit board 12 has a plurality of inner layer patterns, and at least one first conductive layer 121 is arranged between the pattern layer constituting the relay wiring 120 and the power semiconductor circuit unit 20 or the DCDC converter circuit unit 21, so that a shielding effect against noise from the circuit unit can be obtained, and thus the noise resistance can be further improved.

The first drive circuit board 12 also has a second conductive layer 122 arranged on the opposite side of the first conductive layer 121 with the relay wiring 120 interposed therebetween. As a result, a shielding effect against external noise from the outside of the integrated power converter 1 can be obtained.

That is, by sandwiching the relay wiring 120 between the first conductive layer 121 and the second conductive layer 122, a shielding effect against external noise on both surfaces can be obtained, and thus the noise resistance can be further improved.

Figure 6:
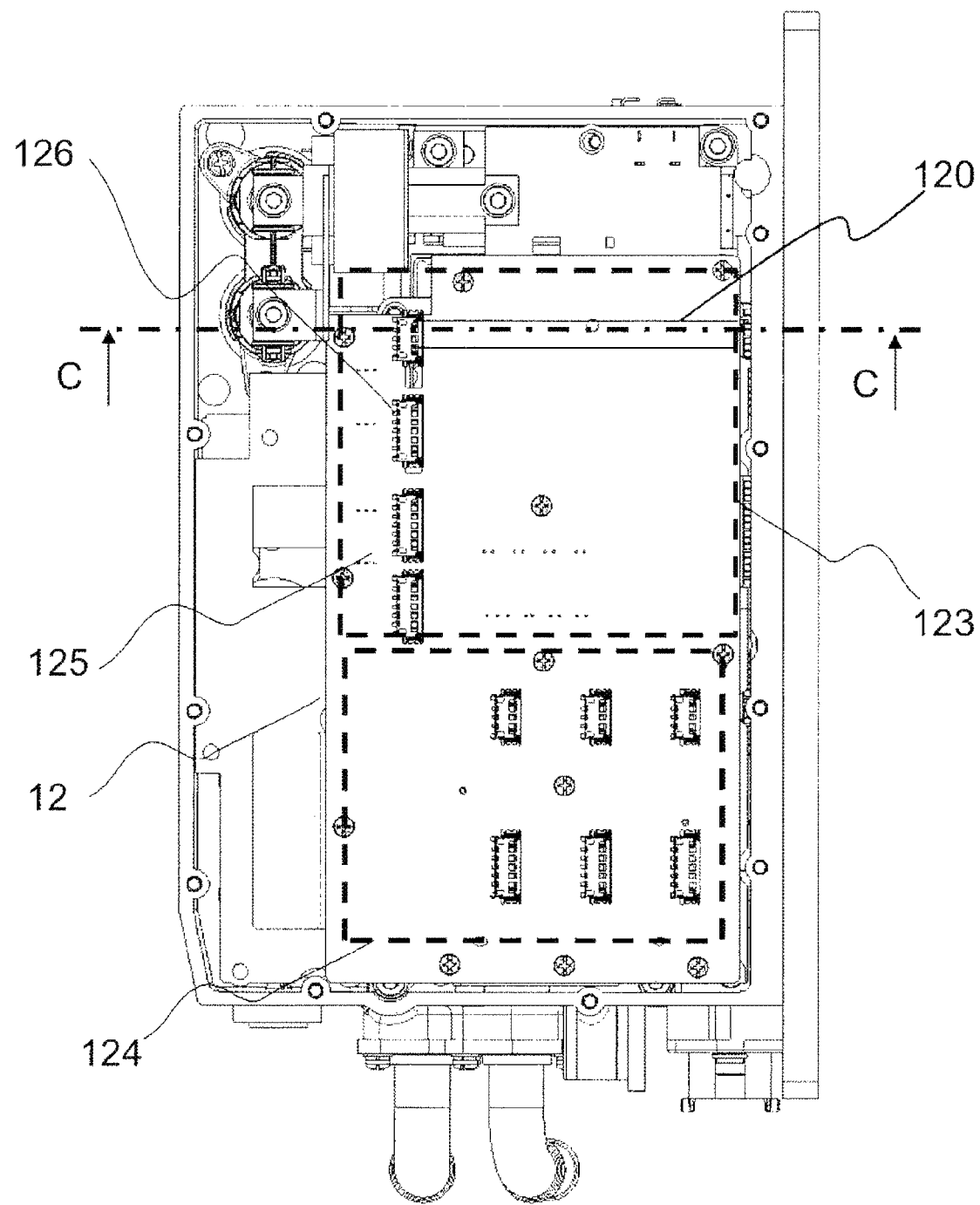
FIG. 6 is a cross-sectional view of the integrated power converter 1 of FIG. 2 viewed from an arrow direction of B.
Figure 7:
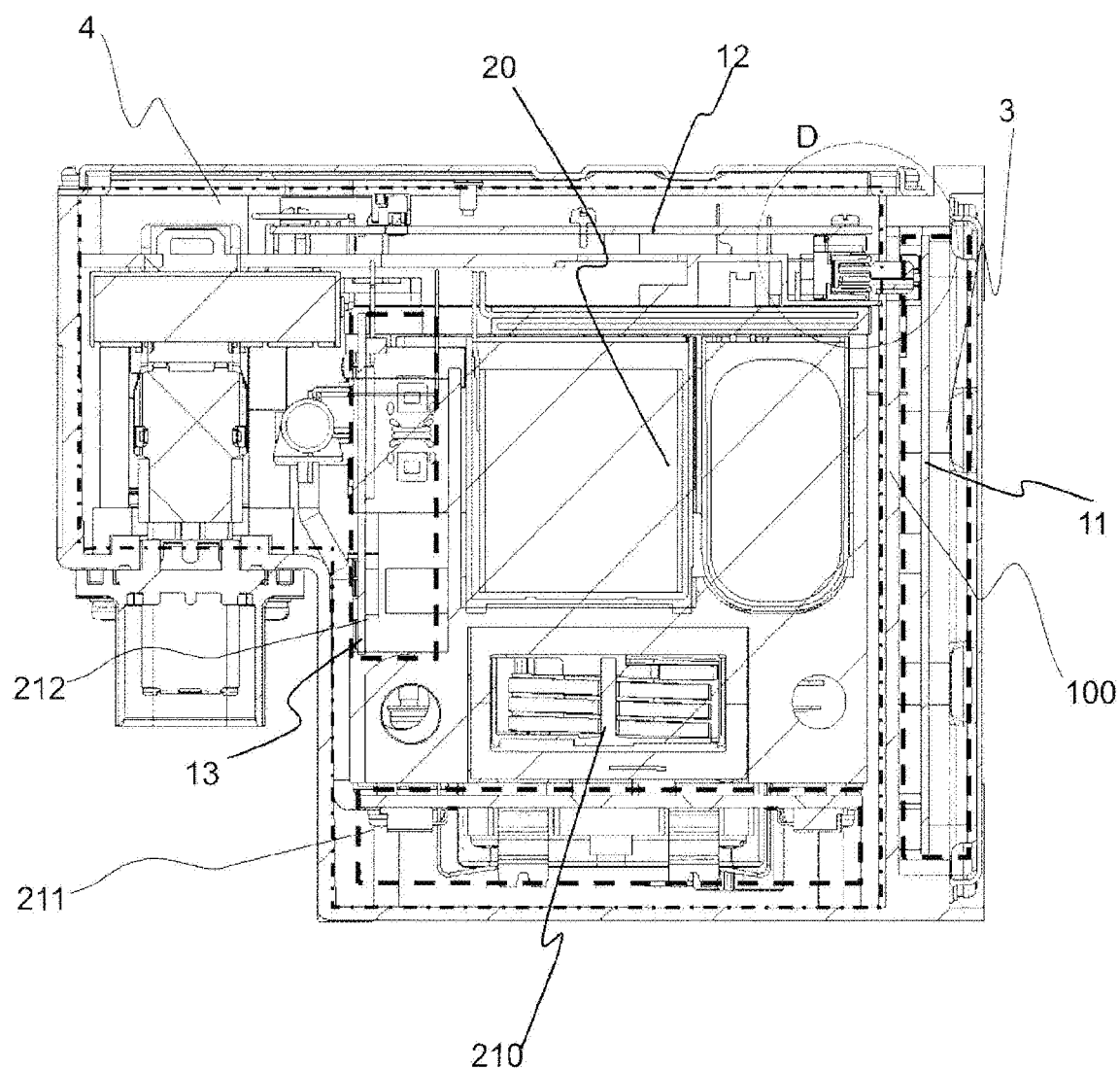
FIG. 7 is a cross-sectional view viewed from an arrow direction of a cross section C of FIG. 6.
Figure 8:
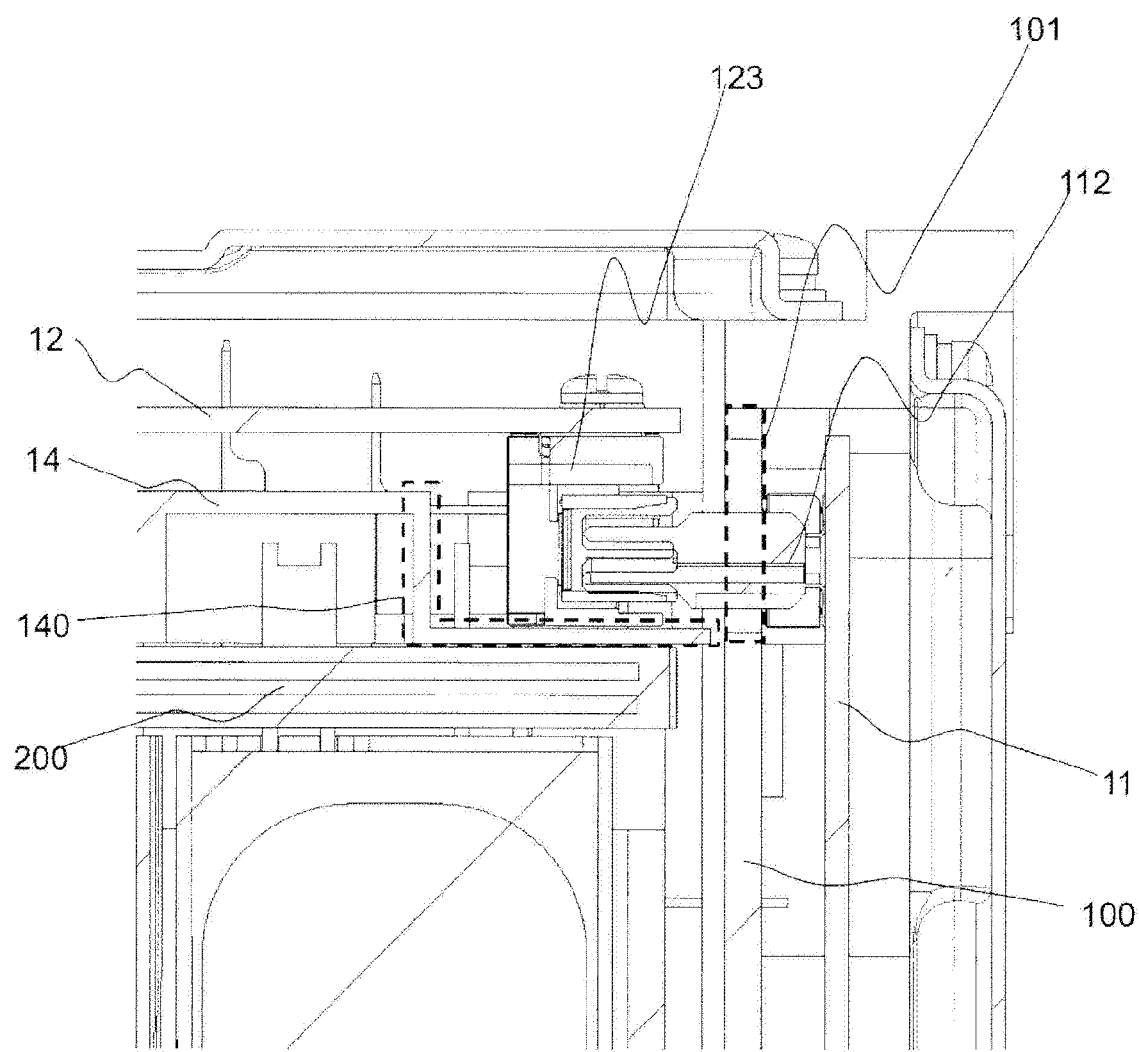
FIG. 8 is an enlarged cross-sectional view of a region D of FIG. 7.

FIG. 6 is a cross-sectional view of the integrated power converter 1 of FIG. 2 viewed from an arrow direction of B. FIG. 7 is a cross-sectional view viewed from an arrow direction of a cross section C of FIG. 6. FIG. 8 is an enlarged cross-sectional view of a region D of FIG. 7.

As shown in FIG. 6, the first drive circuit board 12 is roughly divided into a drive circuit unit 124 that generates a drive signal to be output to the power semiconductor module 203, and a power supply circuit unit 125 including other functions. The portion surrounded by the dotted line of the drive circuit unit 124 is a circuit mounting range of the drive circuit unit 124. A portion surrounded by a dotted line of the power supply circuit unit 125 is a circuit mounting range of the power supply circuit unit 125.

As shown in FIG. 7, the control circuit board 11 is arranged in a first space 3 which is a space different from other components, and, for example, is partitioned with a wall 100 from the second space 4 in which the first drive circuit board 12 is arranged, a space in which the power semiconductor circuit unit 20 is arranged, and a space in which the DCDC converter circuit unit 21 is arranged.

Since the control circuit board 11 is electrically connected to an external interface, when the control circuit board 11 is influenced by the noise, the noise passes through the external interface and goes out, so that noise resistance is particularly required more than other boards.

Therefore, as shown in FIGS. 6 and 8, the second connector 123 mounted on the first drive circuit board 12 is connected to the first connector 112 mounted on the control circuit board 11 through a through hole 101. The through hole 101 is formed in the wall 100. This suppresses the influence of radiation noise generated from other parts.

By directly connecting the first drive circuit board 12 and the control circuit board 11 by using two connectors at a connection portion, the harness can be eliminated and the connection can be made in a short distance, so that it is possible to reduce the influence of radiation noise received in the second space 4.

Also at the connection portion between the first drive circuit board 12 and the second drive circuit board 13, the influence of radiation noise can be reduced by directly connecting using two connectors similarly.

A transformer 210 shown in FIG. 7 is a circuit component that constitutes the DCDC converter circuit unit 21 and performs conversion of a voltage from high voltage to low voltage. Therefore, the transformer 210 generates more noise than the other components constituting the DCDC converter circuit unit 21.

Therefore, the transformer 210 is arranged at a position facing the first drive circuit board 12 with the power semiconductor circuit unit 20 interposed therebetween, and thereby the power semiconductor circuit unit 20 functions as electromagnetic noise shielding member together with the physical distance from the first drive circuit board 12, and can reduce the noise influence.

A low voltage side circuit 211 shown in FIG. 7 has an external interface, and when the low voltage side circuit 211 is influenced by the noise, the noise passes through the external interface and goes out, so that noise resistance is required.

Therefore, the low voltage side circuit 211 is arranged closer to the control circuit board 11 than the high voltage side circuit 212, and the wiring length with the control circuit board 11 is shortened. As a result, the noise resistance to the control circuit board 11 is improved, and the noise influence on the low voltage side circuit 211 is also reduced, so that the noise influence on the low voltage power supply is also reduced.

The drive circuit unit 124 of the first drive circuit board 12 shown in FIG. 6 generates a drive signal to be output to the power semiconductor circuit unit 20. The relay wiring 120 is arranged on the side of the power supply circuit unit 125 so that the relay wiring 120 is not affected by the noise generated at that time, and the physical distance is provided to reduce the noise influence.

As shown in FIG. 6, by arranging the first connector 123 connected to the control circuit board 11 and the second connector 126 connected to the second drive circuit board 13 on the power supply circuit unit 125 side, physical distance is set to reduce the noise influence.

In general, since the connector mounted on the substrate projects from the main surface of the substrate, parts facing the substrate need measures such as avoiding the connector. However, when the support member 14 according to the present embodiment is provided with a through hole in order to avoid the connector 123, the connector 123 is exposed, so that it is susceptible to noise.

Therefore, by providing a concave portion 140 for accommodating the first connector 123 in the support member 14, the influence of radiation noise applied to the first connector 123 is reduced. Furthermore, the concave portion 140 also covers the first connector 123 and contributes to the physical protection of the first connector 123.

REFERENCE SIGNS LIST 1 integrated power converter
2 main circuit unit
3 first space
4 second space
10 casing
11 control circuit board
12 first drive circuit board
13 second drive circuit board
14 support member
20 power semiconductor circuit unit
21 DCDC converter circuit unit
100 wall
101 through hole
110 first control signal
111 second control signal
112 first connector
120 relay wiring
121 first conductive layer
122 second conductive layer
123 second connector
124 drive circuit unit
125 power supply circuit unit
126 second connector
140 concave portion
200 DC current bus bar
202 base plate
203 power semiconductor module
204 X capacitor module
205 EMC filter module
206 flow path forming body
210 transformer
211 low voltage side circuit
212 high voltage side circuit
250 input terminal

The invention claimed is:

1. A power converter comprising:
a power semiconductor circuit unit that converts DC power into AC power to be supplied to a drive motor;
a DCDC converter circuit unit that converts a voltage of DC power;
a first drive circuit board that outputs a drive signal to the power semiconductor circuit unit;
a second drive circuit board that outputs a drive signal to the DCDC converter circuit unit; and
a control circuit board that outputs a first control signal for controlling the first drive circuit board and a second control signal for controlling the second drive circuit board,
wherein the control circuit board is arranged at a position facing the second drive circuit board with the power semiconductor circuit unit and the DCDC converter circuit unit interposed therebetween,
the first drive circuit board is arranged such that a main surface of the first drive circuit board is substantially parallel to an array direction of the control circuit board and the second drive circuit board, and is arranged at a position facing the power semiconductor circuit unit, and
the first drive circuit board has a relay wiring that relays the second control signal output from the control circuit board to the second drive circuit board.

2. The power converter according to claim 1,
wherein the first drive circuit board comprises a first conductive layer, and
the first conductive layer is arranged between the power semiconductor circuit unit or the DCDC converter circuit unit, and the relay wiring.

3. The power converter according to claim 2,
wherein the first drive circuit board comprises a second conductive layer arranged on an opposite side to the first conductive layer with the relay wiring interposed therebetween.

4. The power converter according to claim 1,
further comprising a housing that accommodates the power semiconductor circuit unit, the DCDC converter circuit unit, the first drive circuit board, the second drive circuit board, and the control circuit board, and is formed of a conductive member,
wherein the housing comprises a wall that partitions a first space and a second space, the control circuit board is arranged in the first space, the power semiconductor circuit unit, the DCDC converter circuit unit, the first drive circuit board, and the second drive circuit board are arranged in the second space, and the wall forms a through hole that penetrates a connection member that connects the control circuit board and the first drive circuit board.

5. The power converter according to claim 1, wherein, in the first drive circuit board, at least one of a connection portion with the first drive circuit board and a connection portion with the control circuit board is a connector structure in which a male connector and a female connector are directly connected.

6. The power converter according to claim 1, wherein the DCDC converter circuit unit comprises a transformer, and the transformer is arranged at a position facing the first drive circuit board with the power semiconductor circuit unit interposed therebetween.

7. The power converter according to claim 1, wherein the DCDC converter circuit unit comprises a transformer, a low voltage side circuit electrically connected between the transformer and a low voltage power supply, and a high voltage side circuit electrically connected between the transformer and a high voltage power supply, and the low voltage side circuit is arranged closer to the control circuit board than the high voltage side circuit, and is controlled by a control signal from the control circuit board.

8. The power converter according to claim 1, wherein the first drive circuit board comprises a drive circuit unit that drives the power semiconductor circuit unit, and a power supply circuit unit that supplies power to the drive circuit unit, and the relay wiring is arranged closer to the power supply circuit unit than the drive circuit unit.

9. The power converter according to claim 8, wherein the first drive circuit board comprises a first connector for connecting to the control circuit board, and a second connector for connecting to the second drive circuit board, and the first connector and the second connector are arranged closer to the power supply circuit unit than the drive circuit unit.

10. The power converter according to claim 1, further comprising a support member that supports the first drive circuit board, wherein the first drive circuit board comprises a first connector for connecting to the control circuit board, and the support member forms a concave portion that accommodates the first connector.

* * * * *